(12) United States Patent
Yoo et al.

(10) Patent No.: US 10,366,934 B2
(45) Date of Patent: *Jul. 30, 2019

(54) FACE DOWN DUAL SIDED CHIP SCALE MEMORY PACKAGE

(71) Applicant: Micron Technology, Inc., Boise, ID (US)

(72) Inventors: Chan Yoo, Boise, ID (US); Akshay Singh, Boise, ID (US); Yi Xu, Palo Alto, CA (US); Liana Foster, Boise, ID (US); Steven Eskildsen, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/196,262

(22) Filed: Nov. 20, 2018

(65) Prior Publication Data

US 2019/0088565 A1 Mar. 21, 2019

Related U.S. Application Data

(63) Continuation of application No. 15/621,102, filed on Jun. 13, 2017, now Pat. No. 10,153,221.

(51) Int. Cl.
*H01L 23/02* (2006.01)
*H01L 23/31* (2006.01)
(Continued)

(52) U.S. Cl.
CPC ........ *H01L 23/3114* (2013.01); *H01L 23/481* (2013.01); *H01L 24/19* (2013.01);
(Continued)

(58) Field of Classification Search
CPC ... H01L 23/481; H01L 23/3114; H01L 24/73; H01L 24/19; H01L 24/97; H01L 24/20; H01L 24/45; H01L 25/0657
(Continued)

(56) References Cited

U.S. PATENT DOCUMENTS 5,243,497 A    9/1993  Chiu
5,422,435 A *  6/1995  Takiar ............... H01L 23/49531
                                                        174/521

(Continued)

OTHER PUBLICATIONS

US Patant and Trademark Office; Office Action for U.S. Appl. No. 15/621,102 dated Mar. 21, 2018.
(Continued)

*Primary Examiner* — Luan C Thai
(74) *Attorney, Agent, or Firm* — Parsons Behle & Latimer

(57) ABSTRACT

A semiconductor die that includes a first die located on a first side of an interposer and a second die located on a second side of the interposer. Active sides of the first and second dies may each face the interposer. A bond wire may electrically connect the first die to the second side of the interposer and a bond wire may electrically connect the second die to the first side of the interposer. The bond wires may extend through a plurality of windows in the interposer. First and second dies may be attached to a first side of an interposer and may be electrically connected to a second side of the interposer through windows and third and fourth dies may be attached to a second side of the interposer and may be electrically connected to the first side of the interposer through windows.

15 Claims, 5 Drawing Sheets

(51) Int. Cl.
*H01L 23/00* (2006.01)
*H01L 25/065* (2006.01)
*H01L 23/48* (2006.01)

(52) U.S. Cl.
CPC .............. *H01L 24/20* (2013.01); *H01L 24/45* (2013.01); *H01L 24/73* (2013.01); *H01L 24/97* (2013.01); *H01L 25/0657* (2013.01); *H01L 2224/05553* (2013.01); *H01L 2224/05554* (2013.01); *H01L 2224/32145* (2013.01); *H01L 2224/32225* (2013.01); *H01L 2224/45139* (2013.01); *H01L 2224/45144* (2013.01); *H01L 2224/45147* (2013.01); *H01L 2224/45155* (2013.01); *H01L 2224/45169* (2013.01); *H01L 2224/4824* (2013.01); *H01L 2224/48227* (2013.01); *H01L 2224/48464* (2013.01); *H01L 2224/73215* (2013.01); *H01L 2224/73265* (2013.01); *H01L 2924/15311* (2013.01); *H01L 2924/181* (2013.01); *H01L 2924/3862* (2013.01)

(58) Field of Classification Search
USPC ......................................................... 257/686
See application file for complete search history.

(56) References Cited

U.S. PATENT DOCUMENTS

| | | | | |
|---|---|---|---|---|
| 5,998,860 A * | 12/1999 | Chan | ................. | H01L 23/3107 257/202 |
| 6,051,886 A | 4/2000 | Fogal et al. | | |
| 7,061,092 B2 * | 6/2006 | Akram | ................. | H01L 23/5386 257/678 |
| 7,479,706 B2 * | 1/2009 | Lin | ................. | H01L 23/13 257/778 |
| 7,638,868 B2 * | 12/2009 | Haba | ................. | H01L 23/3121 257/686 |
| 7,855,446 B2 | 12/2010 | Nishiyama et al. | | |
| 8,294,255 B2 * | 10/2012 | Kim | ................. | H01L 21/56 257/692 |
| 8,331,094 B2 | 12/2012 | Ankireddi | | |
| 8,872,318 B2 * | 10/2014 | McElrea | ................. | H01L 24/97 257/276 |
| 8,896,126 B2 * | 11/2014 | Setardja | ................. | H01L 23/13 257/774 |
| 10,153,221 B1 * | 12/2018 | Yoo | ................. | H01L 23/3114 |
| 2003/0064547 A1 | 4/2003 | Akram et al. | | |
| 2008/0303132 A1 | 12/2008 | Mohammed et al. | | |
| 2010/0295166 A1 * | 11/2010 | Kim | ................. | H01L 21/56 257/692 |
| 2013/0137217 A1 | 5/2013 | Kindo et al. | | |
| 2015/0140736 A1 | 5/2015 | Pendse | | |

OTHER PUBLICATIONS

US Patent and Trademark Office; Office Action for U.S. Appl. No. 15/621,102 dated Aug. 27, 2018.

* cited by examiner

FACE DOWN DUAL SIDED CHIP SCALE MEMORY PACKAGE

RELATED APPLICATIONS

The present application is a continuation patent application of U.S. patent application Ser. No. 15/621,102 entitled Face Down Dual Sided Chip Scale Memory Package filed on Jun. 13, 2017, which is incorporated by reference herein in its entirety.

FIELD

The embodiments described herein relate to a semiconductor device having at least a first die located on a first side of an interposer and at least a second die located on a second side of the interposer. The first die may be electrically connected to the second side of the interposer and the second die may be electrically connected to the first side of the interposer.

BACKGROUND

Semiconductor processing and packaging techniques continue to evolve to meet industry demands for increased performance and reduced size. Electronic products, such as cell phones, smart phones, tablets, personal digital assistances, laptop computers, as well as other electronic devices, require packaged semiconductor assemblies having a high density of devices while having a relatively small footprint. For example, the space available for memory devices, processors, and other devices continues to decrease in electronic products providing a need to increase the density of semiconductor devices. The stacking of a semiconductor die is one technique used to increase the density. One potential challenge of stacking of semiconductor dies within a semiconductor package may be providing adequate electrical interconnects within the package and between the stacked semiconductor dies.

One technique for electrically connecting a semiconductor die to a supporting substrate, such as an interposer, or the like (herein collectively referred to as an interposer), is to use a bond wire. One end of the bond wire is attached to a bond pad of the semiconductor die (also referred to herein as a die) with the other end of the bond wire attached to a terminal pad of the interposer. Multiple bond wires may be used to electrically connect a single die with an interposer. As the size of semiconductor devices continues to decrease, the diameter of the individual bond wires may also decrease permitting the bond wires to be placed closer together, which may present disadvantages.

Bond wires are comprised of a conductive material, which may be an expensive material such as, but not limited to, gold, silver, platinum, nickel, copper, or alloys of these metals. The characteristics of the bond wire may be selected based on device specific processing or performance needs. A reduction in the diameter of the bond wires may provide a savings based on the material used in the bond wires, but bond wires having smaller diameters may present disadvantages as would be appreciated by one of ordinary skill in the art.

After stacked dies have been electrically connected to the interposer, the dies and bond wires may be encapsulated in another material, such as an epoxy mold compound, which protects the die and bond wires from environmental contaminants, while also fixing their locations relative to one another within a semiconductor device package. Various encapsulants may be used to encapsulate and protect the dies and bond wires. For example, a polymer material, such as an epoxy, may flow over and around the bond wires and semiconductor die and may be cured after covering the bond wires and dies. However, the flowing epoxy material may displace, or even deform, the bond wires, which has been termed as "sweep." As bond wires are continually placed closer together, sweep of the bond wires caused by the flowing encapsulating material may cause bond wires to contact one another creating a short. Bond wires having smaller diameters may be more susceptible to sweep, which may cause the bond wire to break or cause a bond wire to contact an active surface of the semiconductor die creating a short. Thus, sweep of the bond wires may cause the semiconductor device to malfunction or fail.

FIG. 1 is a schematic of a semiconductor device 100 comprised of two dies 120, 130 stacked on top of an interposer 110. The bottom side of the interposer 110 includes solder balls 101 that may be used to electrically connect the semiconductor device 100 to an external device. An adhesive layer 105 may be used to bond the lower die 120 to the interposer 110. Bond wires 121 electrically connect the first die 120 to the interposer 110 and bond wires 131 electrically connect the second die 130 to the interposer 110. Each bond wire includes a "loop height," "W," which is the distance required to bend the bond wire 180 degrees so that the bond wire can extend off the die 120, 130 and then extend down to the interposer 110. An encapsulating material may be provided over the semiconductor device 100, but the semiconductor device 100 of FIG. 1 is shown without an encapsulating material for illustrative purposes.

The semiconductor device 100 has an overall height "Z", which may be comprised of the height of the solder balls 101, interposer 110, adhesive 105, first die 120, and second die 130. In addition, the loop height, W, of the bond wires 131 also adds to the overall height Z of the semiconductor device 100. The loop height of a bond wire may vary depending on the diameter of the bond wire as well as the material of the bond wire as would be appreciated by one of ordinary skill in the art. Encapsulant material 140, such as epoxy, may be used to encapsulate the components on the device. As shown in FIG. 1, the encapsulant 140 must extend at distance above the loop height W of the bond wires 131 to ensure that the wires do not protrude out from the material 140. The height of the material 140 above the loop height, W, also adds to the height Z of the device 100 as shown in FIG. 1. As discussed above, it may be beneficial to provide a semiconductor device 100 having a high density of devices, which reduces the overall footprint of the device, while having a reduced height Z. The semiconductor device 100 may not have a sufficiently reduced height, Z, and overall footprint for some applications.

FIG. 2 is a schematic of a semiconductor memory device 200 comprised of four memory dies 220, 230, 240, 250 stacked on top of an interposer 202. The memory dies 220, 230, 240, 250 may be comprised of non-volatile memory dies. For example, the memory dies 220, 230, 240, 250 may specifically be NAND-type flash memory dies. A controller 210 is positioned between the memory dies 220, 230, 240, 250 and the interposer 202. Any suitable controller 210 may be used. For example, the controller 210 may be an application-specific integrated circuit (ASIC), a field-programmable gate array (FPGA), an application specific instruction-set processor (ASIP), complex programmable logic device (CPLD), or other logic chip as would be appreciated by one of ordinary skill in the art having the benefit of this disclosure that may interface the memory dies 220, 230, 240, 250 with an external host device. The controller 210 may also perform various other operations, such as, but not limited to, provide error correction, manage data storage, mapping, and/or garbage collection. An adhesive layer 205 is used to bond the controller 210 to the interposer 202 and the controller 210 may be electrically connected to the interposer via a bond wire 211. The adhesive layer 205 may need to be at least 100 microns in order to adequately bond the controller 210 to the interposer 202. The semiconductor device 200 has an overall height Z, which is comprised of the height of the solder balls 201, interposer 202, adhesive 205, controller 201, first die 220, second die 230, third die 240, and fourth die 250. The overall height Z of the device 200 would also include any encapsulant, which has not been shown in FIG. 2 for clarity. In addition, a loop height (not labeled on FIG. 2) of bond wire 251 may also add to the overall height Z of the semiconductor device 200. As discussed above, it may be beneficial to provide a semiconductor device 200 having a high density of devices, which reduces the overall footprint of the device, while having a reduced height Z. The semiconductor memory device 200 may not have a sufficiently reduced height, Z, and overall footprint for some applications.

Additional drawbacks and disadvantages may exist.

Figure 1:
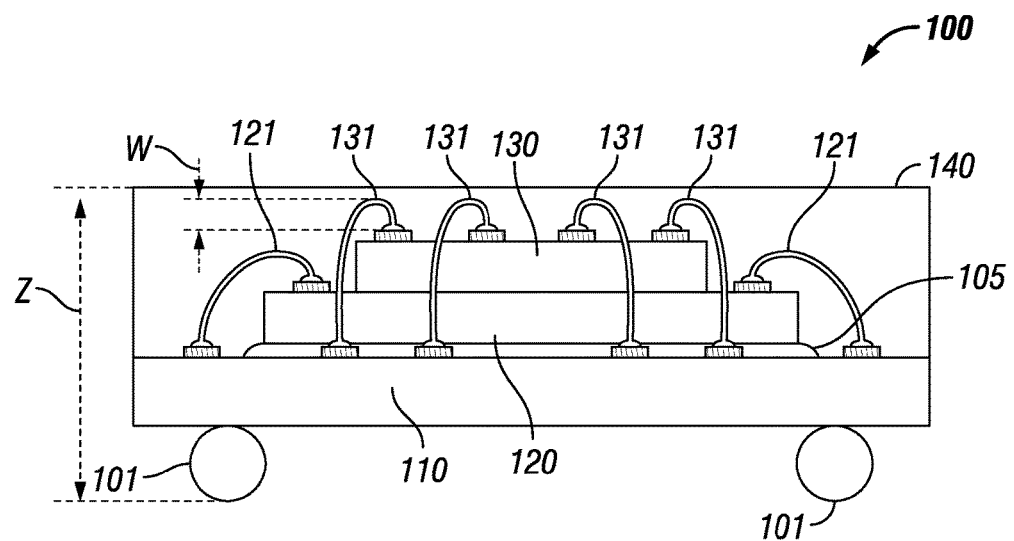
FIG. 1 is a schematic of a prior art semiconductor device.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the invention as defined by the appended claims.

DETAILED DESCRIPTION

Figure 3:
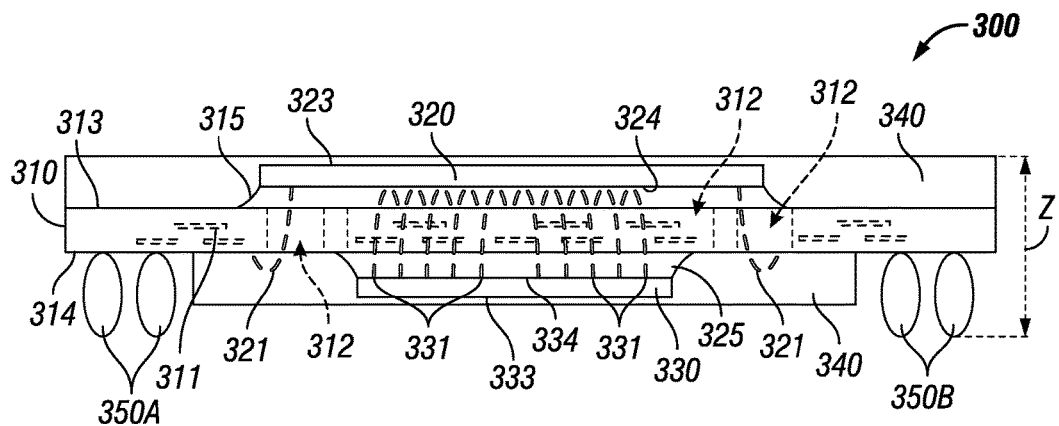
FIG. 3 is a schematic of an embodiment of a semiconductor device in accordance with the disclosure.

FIG. 3 shows a schematic of an embodiment of a semiconductor device 300 having an interposer 310 with a top side, or first side 313, and a bottom side, or second side 314. The interposer 310 includes internal connections 311 that may be used to distribute power, ground, and/or output/input signals within the interposer 310 and to the dies 320, 330 as would be appreciated by one of ordinary skill in the art. The device 300 includes a first semiconductor die 320, also referred to as first die 320, positioned above the first side 313 of the interposer 310 and a second semiconductor die 330, also referred to as second die 330, positioned below the second side 314 of the interposer 310. An adhesive layer 315 attaches the first die 320 to the first side 313 of the interposer 310 and an adhesive layer 325 attaches the second die 330 to the second side 314 of the interposer 310. The first and second dies 320, 330 are electrically connected to the interposer 310. The second side 314 of the interposer 310 may include a plurality of solder balls 350A, 350B that may be used to connect the device 300 to an external device (not shown). The second die 330 is placed between a first plurality of solder balls 350A and second plurality of solder balls 350B as shown in FIG. 3. Among other things, the placement of the second die 330 on the second side 314 of the interposer 310 reduces the overall height Z of the device 300 as compared to a device that includes two stacked dies on the top surface of an interposer, such as the device 100 shown in FIG. 1.

The first die 320 includes an active side 324 and a back side 323, and the second die 330 includes an active side 334 and a back side 333. The active side 324 of the first die 320 is positioned facing or towards the first side 313 of the interposer 310 and the active side 334 of the second die 330 is positioned towards, or adjacent to, the second side 314 of the interposer 310. The positioning of the active sides 324, 334 of the dies 320, 330 may protect the active sides 324, 334 as well as connections between the active sides 324, 334 and the interposer 310, from sweep, or the like, when an encapsulating material, such as an epoxy, 340 flows onto the device 300 to encapsulate and protect the device 300.

Bond wires may be used to connect the active sides 324, 334 of the dies 320, 330 to the interposer 310 as discussed herein. Bond wires 321 may be used to connect the active side 324 of the first die 320 to the second side 314 of the interposer 310. Each of the bond wires 321 may be attached on one end to a bond pad 322A, 322C (shown in FIG. 4) of the active surface 324 of the first die 320, and may be attached on the other end to a bond pad or bond finger 316A, 316C (shown in FIG. 4) of the interposer 310. The bond wires 321 may extend through windows 312A, 312C (shown in FIG. 4), generally referred to as windows 312, that permit the bond wires 321 to extend from the active surface 324 of the first die 320 to the second side 314 of the interposer 310. Similarly, bond wires 331 may be used to connect the active side 334 of the second die 330 to the first side 313 of the interposer 310. Each of the bond wires 331 may be attached on one end to a bond pad 332B, 332D (shown in FIG. 4) of the active surface 334 of the second die 330, and may be attached on the other end to a bond pad or bond finger 316B, 316D (shown in FIG. 4) of the interposer 310. The bond wires 331 may extend through windows 312B, 312D (shown in FIG. 4), generally referred to as windows 312, that permit the bond wires 331 to extend from the active surface 334 of the second die 330 to the first side 313 of the interposer 310.

Among other things, in the illustrated orientation of the first and second dies 320, 330, namely with the active sides 324, 334 facing the interposer 310, the loop height of bond wires 321, 331 does not add to the height Z of the device because the bond wires 321, 331 can extend relatively straight off the active surfaces 324, 334 towards the interposer 310. This orientation places the bond wires 321, 331 between the dies 320, 330 and allows the dies 320, 330 to protect the bond wires 321, 331 from sweep, or the like, during application of an encapsulating material 340 onto the device 300. The extension of the bond wires 321, 331 through windows 312 in the interposer 310 also provides protection from sweep. These features may permit the use of smaller diameter bond wires 321, 331 providing, among other things, a savings in material costs. The bond wires 321 connecting the first die 320 to interposer 310 include a loop height (not labeled on FIG. 3), as the bond wire 321 connects to the second side 314 of the interposer, but as shown the loop height does not add to the overall height Z of the device 300. Likewise, the bond wires 331 connecting the second die 330 to interposer 310 include a loop height, as the bond wires 331 connect to the first side 313 of the interposer, but as shown the loop height for bond wires 331 does not add to the overall height Z of the device 300.

The back side 323 of the first die 320 is located a first distance away from the interposer 310, and the back side 333 of the second die 330 is located a second distance from the interposer 310. As shown in FIG. 3, the first and second bond wires 321, 331 do not extend beyond either the first distance away from the interposer 310 or the second distance from the interposer 310. In this orientation, the dies 320, 330 protect the bond wires 321, 331 from sweep, and the like, as discussed herein, and the bond wires 321, 331 do not add to the height Z of the device 300, as discussed herein.

Figure 4:
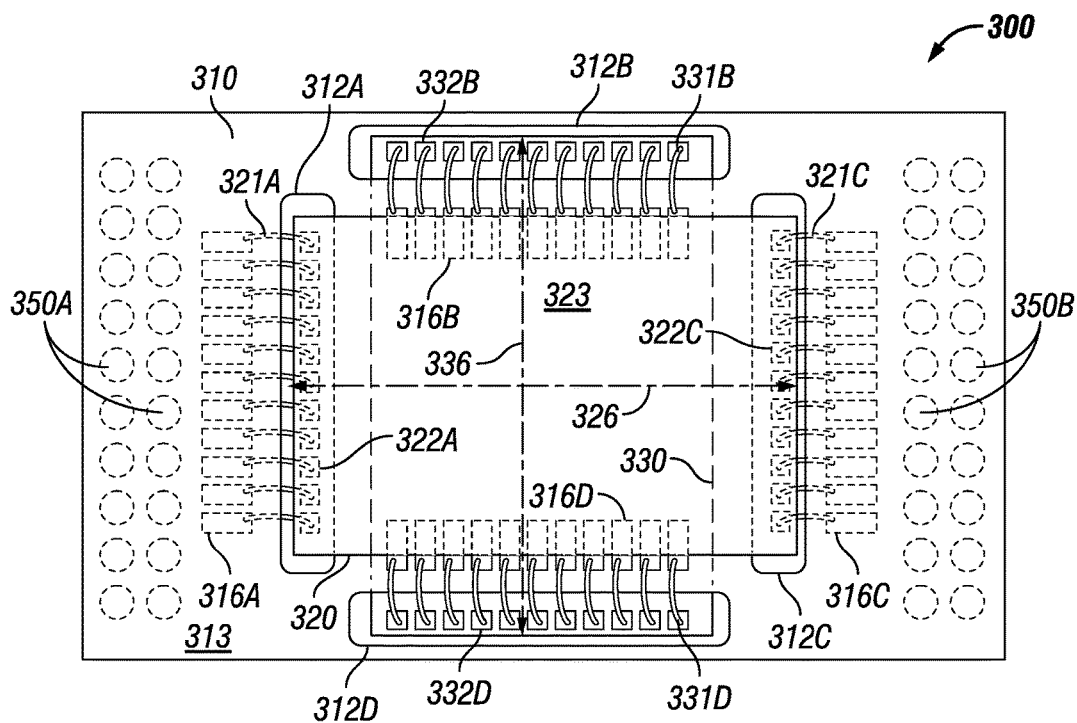
FIG. 4 is a top view schematic of the semiconductor device of FIG. 3.

FIG. 4 is a top view schematic of the device 300 for FIG. 3. For illustrative purposes, the device 300 of FIG. 4 does not show encapsulating material 340. A first die 320 is positioned on the first or top side 313 of the interposer 310. A second die 330, which is visible through windows 312B, 312D, is positioned on the second or bottom side 314 of the interposer 310. The interposer 310 includes a first plurality of bond pads or bond fingers 316B, and a second plurality of bond pads or bond fingers 316D, on the first, or top side 313, of the interposer 310. Likewise, the interposer 310 includes a first plurality of bond pads or bond fingers 316A (shown in dash), and a second plurality of bond pads or bond fingers 316C (shown in dash), on the second or bottom side 314 of the interposer 310. A first plurality of solder balls 350A (shown in dash) are connected to one end of the bottom side 314 of the interposer 310 and a second plurality of solder balls 350B (shown in dash) are connected to the other end of the bottom side 314 of the interposer 310 with the second die 330 (visible through windows 312B, 312D) positioned therebetween. As shown in FIG. 4, the first die 320 is generally rectangular having a longitudinal centerline 326, and the second die 330 is generally rectangular having a longitudinal centerline 336. The longitudinal centerline 336 of the second die 330 being substantially perpendicular with the longitudinal centerline 326 of the first die 320. The number, location, configuration, and/or size of the interposer 310, solder balls 350A, 350B, bond fingers 316A, 316B, 316C, 316D, and windows 312A, 312B, 312C, 312D are for illustrative purposes and may be varied within the scope of the disclosure as would be appreciated by one of ordinary skill in the art having the benefit of this disclosure.

The first die 320 includes a first plurality of bond pads 322A (shown in dash) and a second plurality of bond pads 322C (shown in dash) each being located on the periphery of the die 320 on the active side 324 of the first die 320. Bond wires 321A extend through window 312A connecting each individual bond pad of the first plurality of bond pads 322A to an individual bond finger of the first plurality of bond fingers 316A located on the second side 314 of the interposer 310. Bond wires 321C extend through window 312C connecting each individual bond pad of the second plurality of bond pads 322C to an individual bond finger of the second plurality of bond fingers 316C located on the second side 314 of the interposer 310. The bond wires 321A, 321C electrically connect the active side 324 of the first die 320 to the second or bottom side 314 of the interposer 310. The number, location, configuration, and/or size of the first die 320, bond pads 322A, 322C, and bond wires 321A, 321C are for illustrative purposes and may be varied within the scope of the disclosure as would be appreciated by one of ordinary skill in the art having the benefit of this disclosure.

The second die 330 includes a first plurality of bond pads 332B and a second plurality of bond pads 332D each being located on the periphery of the die 330 on the active side 334 of the second die 330. Bond wires 331B extend through window 312B connecting each individual bond pad of the first plurality of bond pads 332B to an individual bond finger of the first plurality of bond fingers 316B located on the first side 313 of the interposer 310. Bond wires 331D extend through window 312D connecting each individual bond pad of the second plurality of bond pads 332D to an individual bond finger of the second plurality of bond fingers 316D located on the first side 313 of the interposer 310. The bond wires 331B, 331D electrically connect the active side 334 of the second die 330 to the first or top side 313 of the interposer 310. The number, location, configuration, and/or size of the second die 330, bond pads 332B, 332D, and bond wires 331B, 331D are for illustrative purposes and may be varied within the scope of the disclosure as would be appreciated by one of ordinary skill in the art having the benefit of this disclosure.

Figure 2:
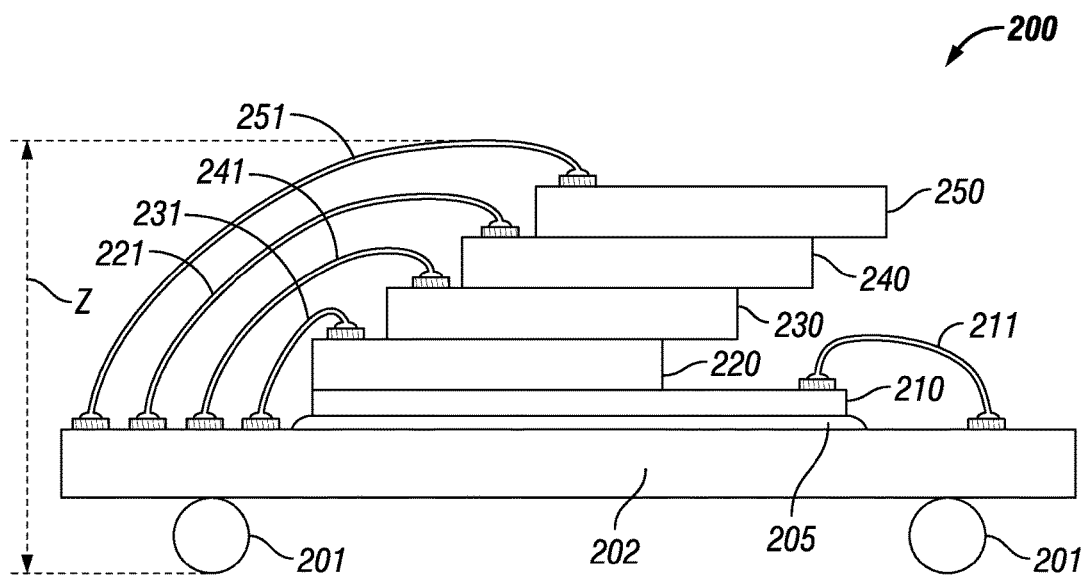
FIG. 2 is a schematic of a prior art semiconductor memory device.
Figure 5:
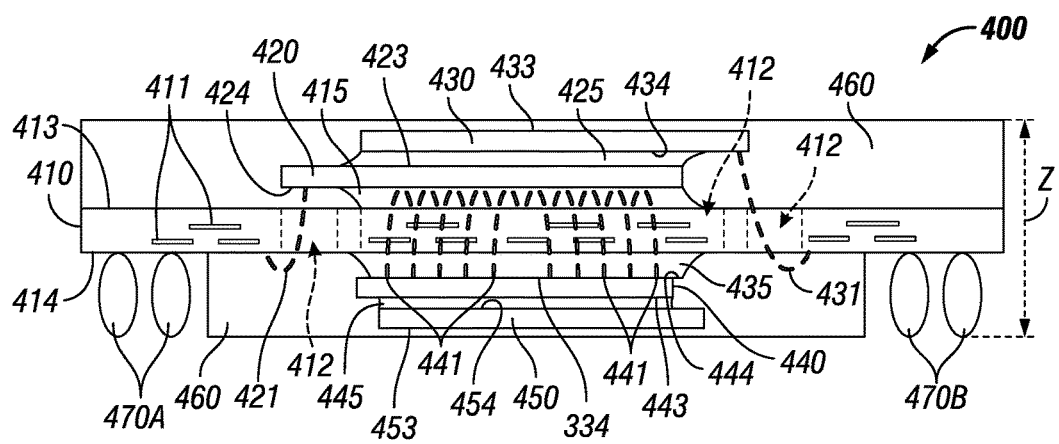
FIG. 5 is a schematic of an embodiment of a semiconductor memory system in accordance with the disclosure.

FIG. 5 shows a schematic of an embodiment of a semiconductor device 400 having an interposer 410 with a top side, or first side 413, and a bottom side, or second side 414. The interposer 410 includes internal connections 411 that may be used to distribute power, ground, and/or output/input signals within the interposer 410 and to the dies 420, 430, 440, 450, as would be appreciated by one of ordinary skill in the art. The device 400 includes a first semiconductor die 420, also referred to as first die 420, and a second semiconductor die 430, also referred to as a second die 430, positioned above the first side 413 of the interposer 410. The device 400 includes a third semiconductor die 440, also referred to as third die 440, and a fourth semiconductor die 450, also referred to as a fourth die 450, positioned below the second side 414 of the interposer 410. An adhesive layer 415 attaches the first die 420 to the first side 413 of the interposer 410 and an adhesive layer 425 attaches the second die 430 to the first die 420. An adhesive layer 435 attaches the third die 440 to the second side 414 of the interposer 410 and an adhesive layer 445 attaches the fourth die 450 to the third die 440. The first, second, third, and fourth dies 420, 430, 440, 450 respectively are electrically connected to the interposer 410. The second side 414 of the interposer 410 may include a plurality of solder balls 470A, 470B that may be used to connect the device 400 to an external device. The third and fourth dies 440, 450 are positioned between a first and second plurality of solder balls 470A, 470B as shown in FIG. 5. The placement of the third and fourth dies 440, 450 on the second side 414 of the interposer 410 reduces the overall height Z of the device 400 as compared to a device that includes four stacked dies on the top surface of an interposer such as the device 200 shown in FIG. 2.

The first die 420 includes an active side 424 and a back side 423, and the second die 430 includes an active side 434 and a back side 433. Likewise, the third die 440 includes an active side 444 and a back side 443, and the fourth die 450 includes an active side 454 and a back side 453. The active side 424 of the first die 420 is positioned facing or towards the first side 413 of the interposer 410. The active side 434 of the second die 430 is positioned facing or towards the back side 423 of the first die 420. The active side 444 of the third die 440 is positioned facing or towards the second side 414 of the interposer 410. The active side 454 of the fourth die 450 is positioned facing or towards the back side 443 of the third die 440. The positioning of the active sides 424, 434, 444, 454 of the dies 420, 430, 440, 450 may protect the active sides 424, 434, 444, 454, as well as connections between the active sides 424, 434, 444, 454 and the interposer 410, from sweep, or the like, when an encapsulating material, such as an epoxy, 460 flows onto the device 400 to encapsulate and protect the device 400.

In one embodiment, the first, second, third, and fourth dies 420, 430, 440, 450 may be comprised of non-volatile memory dies. For example, the dies 420, 430, 440, 450 of FIG. 5 may specifically be NAND-type flash memory dies. In another embodiment, one or more of the four dies, for example the third die 440, may be a controller positioned adjacent to the interposer 410 with the other dies 420, 430, and 450 being comprised of non-volatile memory dies.

Bond wires may be used to connect the active sides 424, 434, 444, 454 of the dies 420, 430, 440, 450 to the interposer 410 as discussed herein. Bond wires 421 may be used to connect the active side 424 of the first die 420 to the second side 414 of the interposer 410. Each of the bond wires 421 may be attached on one end to a bond pad 422 (shown in FIG. 6) of the active surface 424 of the first die 420, and may be attached on the other end to a bond pad or bond finger 416A (shown in FIG. 6) of the interposer 410. The bond wires 421 may extend through window 412A (shown in FIG. 6), generally referred to as window 412, that permits the bond wires 421 to extend from the active surface 424 of the first die 420 to the second side 414 of the interposer 410.

Bond wires 431 may be used to connect the active side 434 of the second die 430 to the second side 414 of the interposer 410. Each of the bond wires 431 may be attached on one end to a bond pad 432 (shown in FIG. 6) of the active surface 434 of the second die 430, and may be attached on the other end to a bond pad or bond finger 416C (shown in FIG. 6) of the interposer 410. The bond wires 431 may extend through window 412C (shown in FIG. 6), generally referred to as window 412, that permits the bond wires 431 to extend from the active surface 434 of the second die 430 to the second side 414 of the interposer 410.

Bond wires 441 may be used to connect the active side 444 of the third die 440 to the first side 413 of the interposer 410. Each of the bond wires 441 may be attached on one end to a bond pad 442 (shown in FIG. 6) of the active surface 444 of the third die 440, and may be attached on the other end to a bond pad or bond finger 416D (shown in FIG. 6) of the interposer 410. The bond wires 441 may extend through window 412D (shown in FIG. 6), generally referred to as window 412, that permits the bond wires 441 to extend from the active surface 444 of the third die 440 to the first side 413 of the interposer 410.

Bond wires 451 (shown in FIG. 6) may be used to connect the active side 454 of the fourth die 450 to the first side 413 of the interposer 410. Each of the bond wires 451 may be attached on one end to a bond pad 452 (shown in FIG. 6) of the active surface 454 of the third die 450, and may be attached on the other end to a bond pad or bond finger 416B (shown in FIG. 6) of the interposer 410. The bond wires 451 may extend through window 412B (shown in FIG. 6), generally referred to as window 412, that permits the bond wires 451 to extend from the active surface 454 of the third die 450 to the first side 413 of the interposer 410.

In the illustrated orientation of the first, second, third, and fourth dies 420, 430, 440, 450, namely with the active sides 424, 434, 444, 454 positioned towards the interposer 410, the loop height of bond wires 421, 431, 441, 451 does not add to the height Z of the device 400 because the bond wires 421, 431, 441, 451 can extend relatively straight off the active surfaces 424, 434, 444, 454 towards the interposer 410. This orientation places the bond wires 421, 431, 441, 451 between the other dies, namely the second die 430 and the fourth die 150, which provides that the dies 420, 430, 440, 450 may protect the bond wires 421, 431, 441, 451 from sweep, or the like, during application of an encapsulating material 460 onto the device 400. The extension of the bond wires 421, 431, 441, 451 through windows 412 in the interposer 410 also provides protection from sweep. These features may permit the use of smaller diameter bond wires 421, 431, 441, 451 providing, among other things, a savings in material costs.

The bond wires 421 connecting the first die 420 to interposer 410 include a loop height, as the bond wires 421 connect to the second side 414 of the interposer, but the loop height does not add to the overall height Z of the device 400. Likewise, the bond wires 431 connecting the second die 430 to interposer 410 include a loop height, as the bond wires 431 connect to the second side 414 of the interposer, but as shown the loop height does not add to the overall height Z of the device 400. Likewise, the bond wires 441 connecting the third die 440 to interposer 410 include a loop height, as the bond wires 441 connect to the first side 413 of the interposer, but as shown the loop height does not add to the overall height Z of the device 400. Likewise, the bond wires 451 connecting the fourth die 450 to interposer 410 include a loop height, as the bond wires 451 connect to the first side 413 of the interposer, but as shown the loop height does not add to the overall height Z of the device 400.

Figure 6:
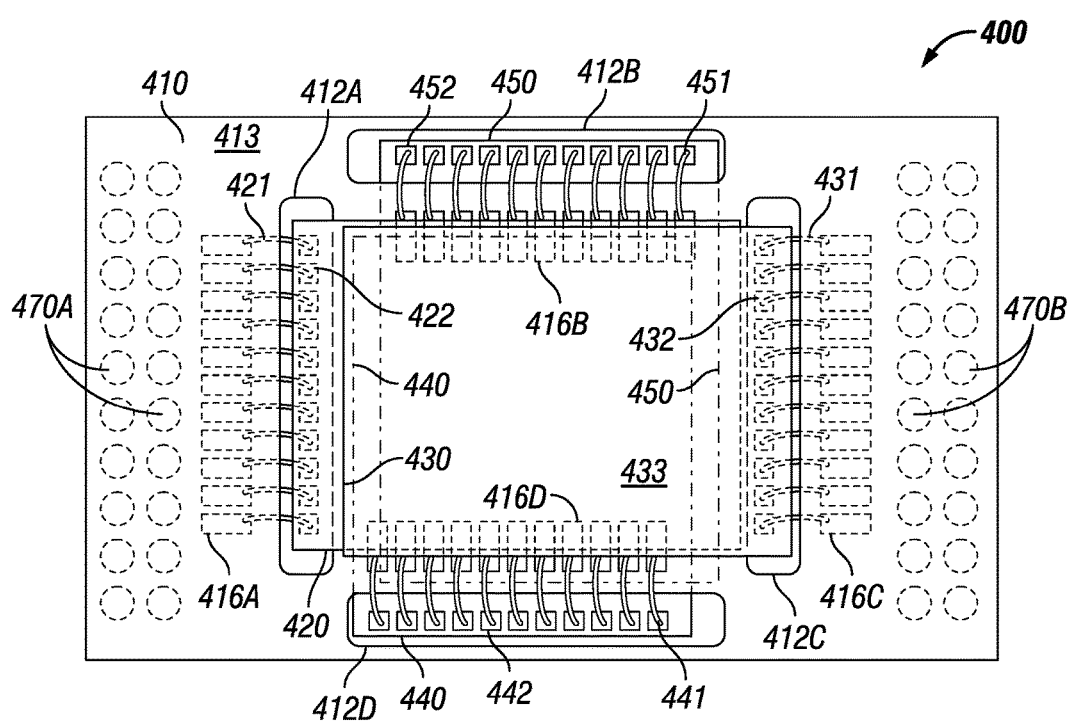
FIG. 6 is a top view schematic of the semiconductor memory system of FIG. 5.

FIG. 6 is a top view schematic of the device 400 of FIG. 5. For illustrative purposes, the device 400 of FIG. 6 does not show any encapsulating material 460. A first die 420 is positioned on the first, or top side 413, of the interposer 410. A second die 430 is also positioned on the first, or top side 413, of the interposer 410. The second die 430 is stacked on the first die 420 with the second die 430 being offset with respect to the first die 420. A third die 440, which is visible through window 412D, is positioned on the second, or bottom side 414, of the interposer 410. A fourth die 450, which is visible through window 412B, is also positioned on the second, or bottom side 414, of the interposer 410. The fourth die 450 is stacked on the third die 440 with the fourth die 450 being offset with respect to the third die 440.

The interposer 410 includes a first plurality of bond pads or bond fingers 416B and a second plurality of bond pads or bond fingers 416D, on the first or top side 413 of the interposer 410. Likewise, the interposer 410 includes a first plurality of bond pads or bond fingers 416A (shown in dash) and a second plurality of bond pads or bond fingers 416C (shown in dash) on the second or bottom side 414 of the interposer 410. A first plurality of solder balls 470A (shown in dash) are connected to one end of the bottom side 414 of the interposer 410 and a second plurality of solder balls 470B (shown in dash) are connected to the other end of the bottom side 414 of the interposer 410 with the third and fourth dies 440,450 (visible through windows 412B, 412D) positioned therebetween. As shown in FIG. 6, the dies 420, 430, 440, 450 comprise a generally rectangular shape with the third and fourth dies 440, 450 being oriented 90 degrees with respect to the first and second dies 420, 430. In other words, the longitudinal centerlines of the third and fourth dies 440, 450 are substantially perpendicular to the longitudinal centerlines of the first and second dies 420, 430. The number, location, configuration, and/or size of the interposer 410, solder balls 470A, 470B, bond fingers 416A, 416B, 416C, 416D, and windows 412A, 412B, 412C, 412D are for illustrative purposes and may be varied within the scope of the disclosure as would be appreciated by one of ordinary skill in the art having the benefit of this disclosure.

The first die 420 includes a plurality of bond pads 422 (shown in dash) and the second die 430 includes a plurality of bond pads 432 (shown in dash) each being located on the periphery of the respective dies 420, 430 on the active sides 424, 434 of the dies 420, 430. Bond wires 421 extend through window 412A connecting each individual bond pad of the plurality of bond pads 422 of the first die 420 to an individual bond finger of the first plurality of bond fingers 416A located on the second side 414 of the interposer 410. Bond wires 431 extend through window 412C connecting each individual bond pad of the plurality of bond pads 432 to an individual bond finger of the second plurality of bond fingers 416C located on the second side 414 of the interposer 410. The bond wires 421 electrically connect the active side 424 of the first die 420 to the second or bottom side 414 of the interposer 410. The bond wires 431 electrically connect the active side 434 of the second die 430 to the second or bottom side 414 of the interposer 410. The number, location, configuration, and/or size of the first die 420, second die 430, bond pads 422, 432, and bond wires 421, 431 are for illustrative purposes and may be varied within the scope of the disclosure as would be appreciated by one of ordinary skill in the art having the benefit of this disclosure.

The third die 440 includes a plurality of bond pads 442, and the fourth die 450 includes a plurality of bond pads 452, each being located on the periphery of the respective dies 440, 450 on the active sides 444, 454 of the dies 440, 450. Bond wires 441 extend through window 412D connecting each individual bond pad of the plurality of bond pads 442 of the fourth die 440 to an individual bond finger of the first plurality of bond fingers 416D located on the first side 413 of the interposer 410. Bond wires 451 extend through window 412B connecting each individual bond pad of the plurality of bond pads 452 to an individual bond finger of the second plurality of bond fingers 416B located on the first side 413 of the interposer 410. The bond wires 441 electrically connect the active side 444 of the third die 440 to the first or top side 413 of the interposer 410. The bond wires 451 electrically connect the active side 454 of the fourth die 450 to the first or top side 413 of the interposer 410. The number, location, configuration, and/or size of the third die 440, fourth die 450, bond pads 442, 452, and bond wires 441, 451 are for illustrative purposes and may be varied within the scope of the disclosure as would be appreciated by one of ordinary skill in the art having the benefit of this disclosure.

In an embodiment, the active sides 424, 444 of the first die 420 and the third die 440 may be positioned away from the interposer 410 with the active side 434, 454 of the second die 430 and the fourth die 450 positioned toward or facing the interposer 410. In this orientation, bond wires 431 electrically connect the active side 434 of the second die to the second side 414 of the interposer 410 through a window 412 and, thus, do not add to the overall height Z of the device 400. Likewise, bond wires 451 electrically connect the active side 454 of the fourth die to the first side 413 of the interposer 410 through a window 412, which also does not add to the overall height Z of the device 400. The active surface 424 of the first die 420 may be electrically connected to the first side 413 of the interposer 410 by traditional wire bonding and the active surface 444 of the third die 440 may be electrically connected to the second side 414 of the interposer 410 by traditional wire bonding. However, the loop height of the traditional bond wires connecting the first and third dies 420, 440 may not add to the overall height Z of the device 400 because the first die 420 is positioned between the second die 430 and the interposer 410 and the third die 440 is positioned between the fourth die 450 and the interposer 410.

In an embodiment, one or more active sides 424, 434, 444, 454 of the first, second, third, and fourth dies 420, 430, 440, 450 may be position to face away from the interposer 410. Traditional wire bonding may be used to electrically connect the active sides 424, 434, 444, 454 that face away from the interposer 410 to the same side of the interposer 410 upon which the die 420, 430, 440, 450 is located. However, the overall height Z of the device 400 may be reduced in comparison to prior devices by orienting of one or more active sides 424, 434, 444, 454 to face the interposer 410. For example, the third and fourth dies 440, 450 may be oriented with their active sides 444, 454 facing away from the interposer 410 and being connected by traditional bond wires. Such an orientation may not add to the overall height Z of the device 400 by locating of the third and fourth dies 440, 450 on the second side 414 of the interposer 400 between the first and second plurality of solder balls 470A, 470B. Various other orientations of the dies 420, 430, 440, 450 may also exist.

Figure 7:
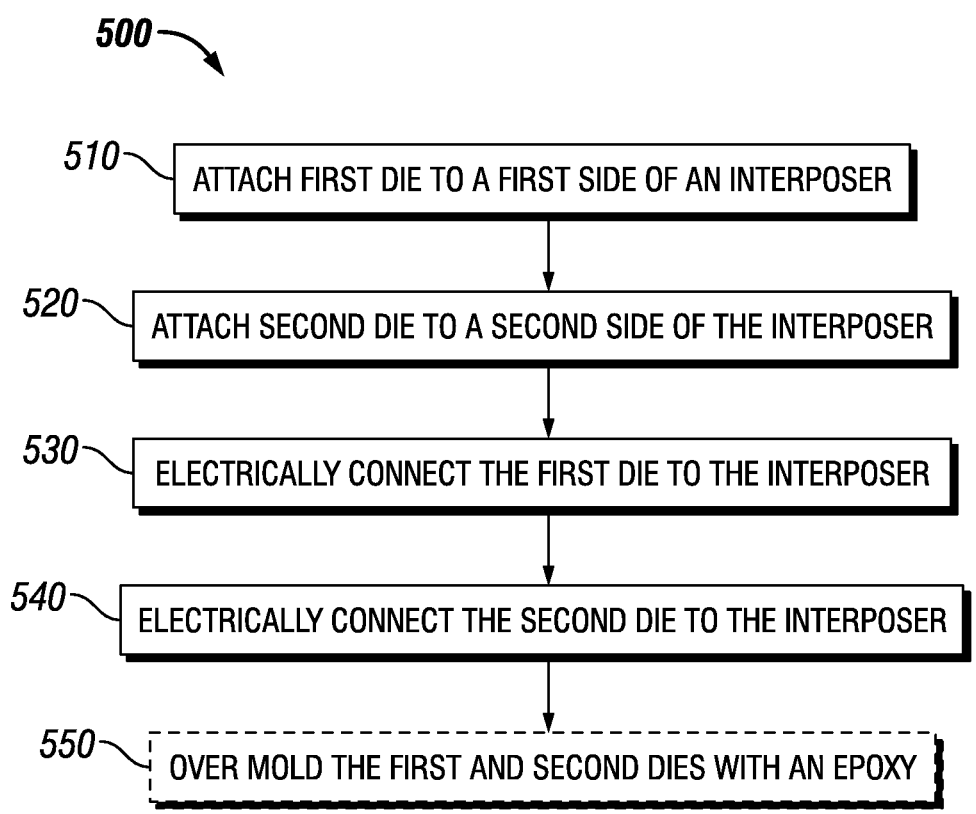
FIG. 7 is a flow chart of an embodiment of a method of making a semiconductor device in accordance with the disclosure.

FIG. 7 is a flow chart for one embodiment of a method 500 of making a semiconductor device. The method 500 includes the step 510 of attaching a first die to a first side of an interposer and the step 520 of attaching a second die to a second side of the interposer. The first and second dies may be various semiconductor dies including, but not limited to, various non-volatile memory dies such as a NAND-type flash memory die and/or controller/logic dies. The method 500 includes electrically connecting the first die to the interposer at step 530. The first die may be electrically connected to the second side of the interposer. For example, a bond wire may extend through a window, slot, or opening in the interposer and connect a bond pad on the first die to a bond pad on the second side of the interposer. The first die may be oriented so that an active side of the first die is positioned facing the first side of the interposer.

The method 500 includes electrically connecting the second die to the interposer at step 540. The second die may be electrically connected to the first side of the interposer. For example, a bond wire may extend through a window, slot, or opening in the interposer and connect a bond pad on the second die to a bond pad on the first side of the interposer. The second die may be oriented so that an active side of the second die is positioned facing the second side of the interposer. The method 500 may include over molding the first and second dies with an epoxy at step 550.

Figure 8:
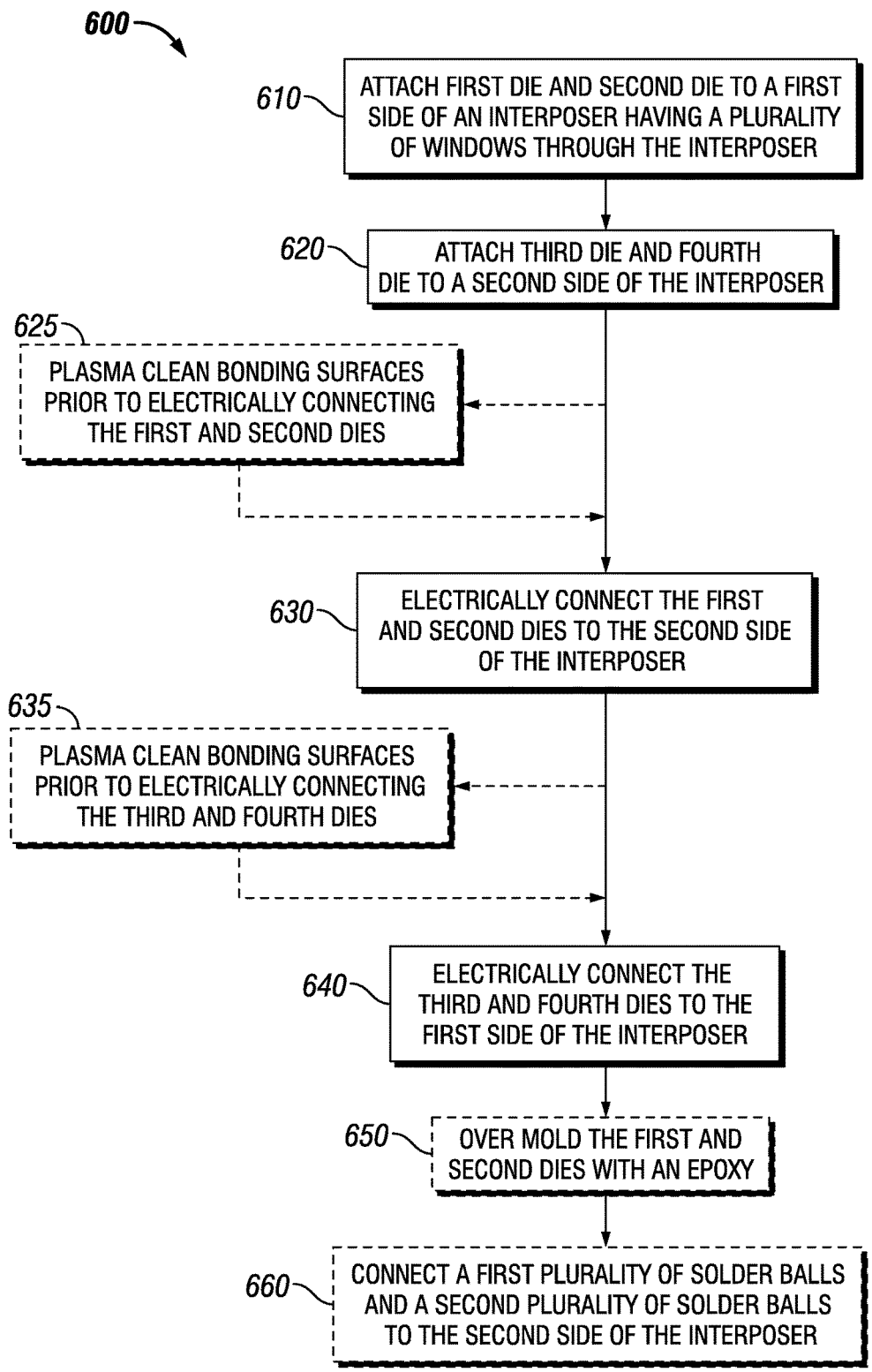
FIG. 8 is a flow chart of an embodiment of a method of making a semiconductor memory system in accordance with the disclosure.

FIG. 8 is a flow chart for one embodiment of a method 600 of making a semiconductor memory system. The method 600 includes the step 610 of attaching a first die and a second die to a first side of an interposer that includes a plurality of windows through the interposer. The method 600 includes the step 620 of attaching a third die and a fourth die to a second side of the interposer. Each die may be one of various semiconductor dies including, but not limited to, various non-volatile memory dies such as a NAND-type flash memory die. In one embodiment, one or more dies may be a controller semiconductor die with the other dies being non-volatile memory dies.

The method 600 includes electrically connecting the first and second dies to the second side of the interposer at step 630. The first and second dies may be connected to the second side of the interposer via bond wires that extend through a window in the interposer. Optionally, the method may include plasma cleaning the bonding surfaces prior to electrically connecting the first and second dies at step 625. The method 600 includes electrically connecting the third and fourth dies to the first side of the interposer at step 640. The third and fourth dies may be connected to the first side of the interposer via bond wires that extend through a window in the interposer. Optionally, the method may include plasma cleaning the bonding surfaces prior to electrically connecting the third and fourth dies at step 635.

The method 600 may include over molding the first, second, third, and fourth dies with an epoxy at step 650. The method 600 may include connecting a first plurality of solder balls and a second plurality of solder balls to the second side of the interposer at step 660.

Although this disclosure has been described in terms of certain embodiments, other embodiments that are apparent to those of ordinary skill in the art, including embodiments that do not provide all of the features and advantages set forth herein, are also within the scope of this disclosure. Accordingly, the scope of the present disclosure is defined only by reference to the appended claims and equivalents thereof.

What is claimed is:

1. A semiconductor device comprising:
   an interposer having a first side and a second side opposite of the first side;
   a first die having a perimeter located on the first side of the interposer, wherein the first die comprises an active side opposite a back side, the active side of the first die facing the first side of the interposer;
   a first window through the interposer, wherein at least a portion of the first window extends outside of the perimeter of the first die;
   at least one bond wire electrically connecting the first die to the second side of the interposer through the first window;
   a second die having a perimeter located on the second side of the interposer;
   a second window through the interposer, wherein at least a portion of the second window extends outside of the perimeter of the second die; and
   at least one bond wire electrically connecting the second die to the first side of the interposer through the second window.

2. The semiconductor device of claim 1, wherein the second die comprises an active side opposite a back side, the active side of the second die facing the second side of the interposer.

3. The semiconductor device of claim 2, wherein the first die and the second die are each rectangular having a longitudinal axis and wherein the longitudinal axis of the second die is substantially perpendicular to the longitudinal axis of the first die.

4. The semiconductor device of claim 3, the second side of the interposer further comprising a first plurality of solder balls and a second plurality of solder balls.

5. The semiconductor device of claim 4, wherein the second die is positioned between the first plurality of solder balls and the second plurality of solder balls.

6. The semiconductor device of claim 5, wherein the first die comprises a memory die and the second die comprises a controller die.

7. A method of making a semiconductor device comprising:
   attaching a first die having a perimeter to a first side of an interposer, the interposer having a first opening, wherein a portion of the first opening extends outside of the perimeter of the first die;
   electrically connecting the first die to a second side of the interposer via a bond wire through the first opening in the interposer;
   attaching a second die having a perimeter to a second side of the interposer, the interposer having a second opening, wherein a portion of the second opening extends outside of the perimeter of the second die; and
   electrically connecting the second die to the first side of the interposer via a bond wire through the second opening in the interposer.

8. The method of claim 7, comprising electrically connecting the first die to the second side of the interposer via a bond wire through a third opening in the interposer.

9. The method of claim 8, wherein a portion of the third opening extends outside of the perimeter of the first die.

10. The method of claim 9, comprising electrically connecting the second die to the first side of the interposer via a bond wire through a fourth opening in the interposer.

11. The method of claim 10, wherein a portion of the fourth opening extends outside of the perimeter of the second die.

12. A semiconductor device comprising:
    an interposer having a first side and a second side opposite of the first side;
    a first die located on the first side of the interposer;
    a first window through the interposer;
    a second window through the interposer, wherein a first portion of the first die is positioned over the first window and wherein a second portion of the first die is positioned over the second window;
    a first bond wire that electrically connects the first die to the second side of the interposer through the first window;
    a second bond wire that electrically connects the first die to the second side of the interposer through the second window;
    a second die located on the second side of the interposer;
    a third window through the interposer;
    a fourth window through the interposer;
    a third bond wire that electrically connects the second die to the first side of the interposer through the third window; and
    a fourth bond wire that electrically connects the second die to the first side of the interposer through the fourth window.

13. The semiconductor device of claim 12, wherein a first portion of the second die is positioned over the third window and wherein a second portion of the second die is positioned over the fourth window.

14. The semiconductor device of claim 12, wherein the first die and the second die are each rectangular having a longitudinal axis and wherein the longitudinal axis of the second die is substantially perpendicular to the longitudinal axis of the first die.

15. The semiconductor device of claim 14, wherein the first die is positioned between the third window and the fourth window and wherein the second die is positioned between the first window and the second window.

* * * * *